(12) United States Patent
Bapat et al.

(10) Patent No.: US 7,705,671 B1
(45) Date of Patent: *Apr. 27, 2010

(54) AUDIO AMPLIFIER HAVING AN INPUT STAGE WITH A SUPPLY-INDEPENDENT REFERENCE VOLTAGE

(75) Inventors: Sumant Bapat, Santa Clara, CA (US); Ansuya Bhatt, Cupertino, CA (US); Christopher B. Heithoff, Sunnyvale, CA (US); Raminder Jit Singh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 188 days.

This patent is subject to a terminal disclaimer.

(21) Appl. No.: 11/460,931

(22) Filed: Jul. 28, 2006

(51) Int. Cl.
  *H03F 3/38* (2006.01)
  *H03F 3/45* (2006.01)
(52) U.S. Cl. .......................... 330/10; 330/258
(58) Field of Classification Search .............. 330/10, 330/69, 136, 207 A, 251–262; 381/120; 363/41; 375/238, 239; 445/332; 327/307, 327/336, 337
  See application file for complete search history.

(56) References Cited

U.S. PATENT DOCUMENTS

| | | | | |
|---|---|---|---|---|
| 5,831,475 A | * | 11/1998 | Myers et al. | 330/10 |
| 6,011,435 A | * | 1/2000 | Takeyabu et al. | 330/252 |
| 6,160,446 A | * | 12/2000 | Azimi et al. | 330/69 |
| 6,417,728 B1 | * | 7/2002 | Baschirotto et al. | 330/9 |
| 6,507,223 B2 | * | 1/2003 | Felder | 327/77 |
| 7,170,340 B1 | * | 1/2007 | Bhatt et al. | 330/10 |
| 2001/0011922 A1 | * | 8/2001 | Dawes | 330/9 |
| 2002/0180529 A1 | * | 12/2002 | Maejima | 330/261 |
| 2006/0125554 A1 | * | 6/2006 | Chen et al. | 330/10 |

OTHER PUBLICATIONS

LM4871 Boomer, "3W Audio Power Amplifier with Shutdown Mode," National Semiconductor Corporation, Jan. 2003.
LM4671 Boomer, "Filterless High Efficiency 2.5W Switching Audio Amplifier," National Semiconductor Corporation, Mar. 2005.
U.S. Appl. No. 11/460,937, filed Jul. 28, 2006, Sumant Bapat et al.

* cited by examiner

*Primary Examiner*—Robert Pascal
*Assistant Examiner*—Khiem D Nguyen
(74) *Attorney, Agent, or Firm*—Darby & Darby P.C.; Matthew M. Gaffney (57) ABSTRACT

An input stage for an audio power amplifier is provided. The input stage includes a fully differential amplifier and a supply-independent reference voltage generator. The supply-independent reference voltage generator provides a supply-independent reference voltage that is used as the common mode voltage of the output of the fully differential amplifier.

20 Claims, 6 Drawing Sheets

FIG. 6

AUDIO AMPLIFIER HAVING AN INPUT STAGE WITH A SUPPLY-INDEPENDENT REFERENCE VOLTAGE

FIELD OF THE INVENTION

The invention is related to amplifiers, and in particular but not exclusively, to an audio power amplifier having an input stage with improved PSRR.

BACKGROUND OF THE INVENTION

In audio applications, a power amplifier is usually incorporated to drive a speaker load. The speaker load value typically varies from 4 ohm to 32 ohm. Traditionally, class AB amplifiers have been used to drive the speaker load. A class AB amplifier includes a differential amplifier, a push-pull output stage, and a class AB bias circuit. The push-pull output stage includes a p-type transistor and an n-type transistor that drive a signal to an output. Further, the class AB bias circuit is configured to bias the push-pull output stage.

The main drawback of using class AB amplifiers is low efficiency. Low efficiency translates into more power dissipation inside the chip which in turn mandates using a heat sink to dissipate the heat and also lowers the battery life. This increases the cost and the area of the audio solution.

A class-D amplifier is attractive because of the higher power efficiency compared to a class AB amplifier, which realizes a longer battery life and eliminates the heat sink requirement. This allows design of compact and low cost multi-channel high-power systems. The class D amplifiers partially mitigate the concern of thermal runaway by using transistors as switches.

Class D amplifiers typically employ either pulse width modulation or sigma-delta modulation. The high frequency carrier signal (e.g. a triangle or a pulse waveform) is modulated by the audio input signal. This modulated signal is applied to the speaker by power transistors which are either completely on or completely off. This way the power dissipation is minimal inside these power transistors.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to an input stage for an audio power amplifier. The input stage includes a fully differential amplifier and a supply-independent reference voltage generator. The supply-independent reference voltage generator provides a supply-independent reference voltage that is used as the common mode voltage of the output of the fully differential amplifier.

Figure 1:
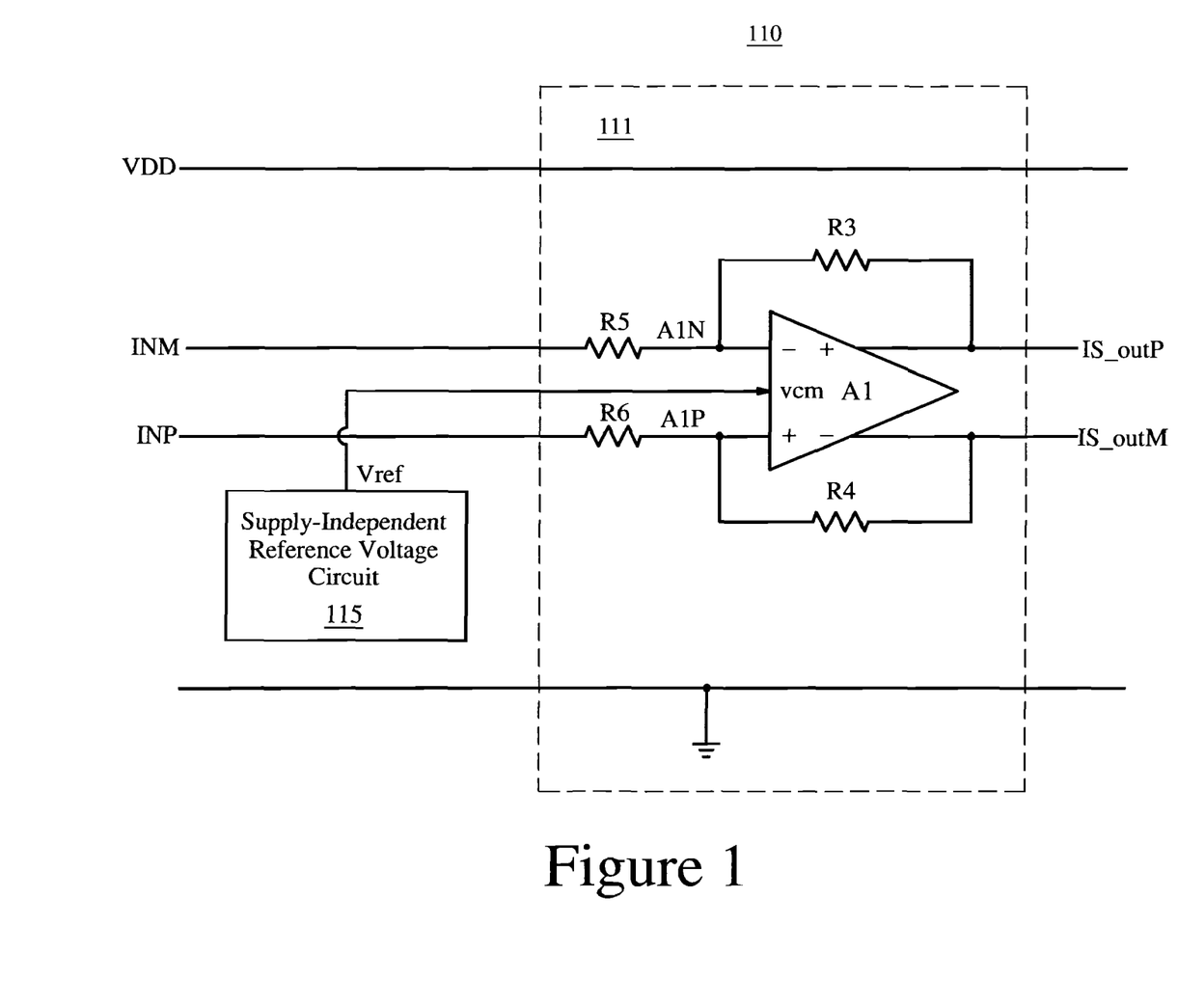
FIG. 1 shows a block diagram of an embodiment of an input stage for an audio power amplifier.

FIG. 1 shows a block diagram of input stage 110, which may be employed as an input stage for an audio power amplifier. Input stage 110 includes fully differential amplifier 111 and supply-independent reference voltage circuit 115. Fully differential amplifier 111 includes fully differential op amp A1 and resistors R3-R6. In one embodiment, some or all of the resistors are external components.

Input stage 110 is operable to provide input stage output signal IS_out. Signal IS_out is a differential signal that includes signal IS_outP and signal IS_outM.

Fully differential amplifier 111 has a differential gain that is defined by resistors R3-R6. Additionally, the common mode voltage of signal IS_out is determined by the voltage provided at the common mode voltage input of A1. That is, (IS_outP+IS_outM)/2 is substantially equal to the voltage provided at the common mode voltage input (vcm) of A1 (namely, supply-independent reference voltage Vref).

Supply-independent reference voltage circuit 115 is arranged to provide supply-independent reference voltage Vref to the common mode voltage input of fully differential op amp A1. In one embodiment, supply-independent reference voltage circuit 115 includes a bandgap reference circuit, and voltage Vref is a bandgap voltage or a scaled bandgap voltage. However, the invention is not so limited, and in various embodiments, various other techniques may be used for generating a supply-independent reference voltage.

In this way, supply voltage disturbances are not converted to differential output signals at the output of fully differential amplifier 110. For mobile applications, the power supply voltage VDD may have disturbances for a variety of different reasons. In an embodiment of an audio power amplifier in which fully differential amplifier 111 and supply-independent reference voltage circuit 115 are included, the audio power amplifier has high PSRR (power supply rejection ratio) which is almost independent of gain setting resistor mismatches.

Figure 2:
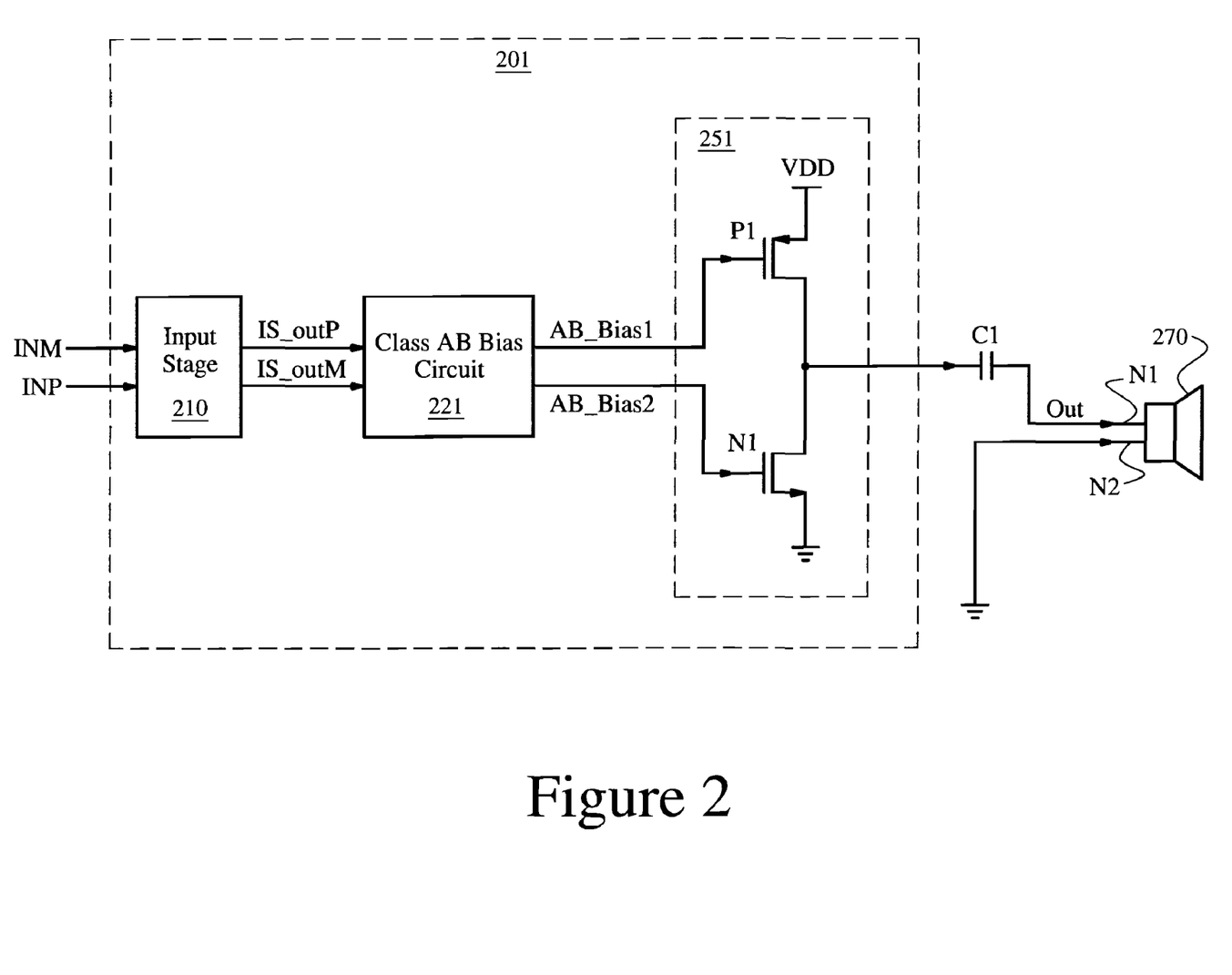
FIG. 2 illustrates a block diagram of an embodiment of a speaker and a class AB amplifier that includes the input stage of FIG. 1.

FIG. 2 illustrates a block diagram of an embodiment of class AB amplifier 201, capacitor C1, and speaker 270. Class AB amplifier 201 includes input stage 210, class AB bias circuit 221, and class AB output stage 251. Class AB output stage 251 includes transistors P1 and N1. Input stage 210 is an embodiment of input stage 110 of FIG. 1.

Class AB output stage 251 is a push-pull output stage that is arranged to provide output signal OUT in response to class AB bias signals AB_Bias1 and AB_Bias2. Output signal OUT drives speaker 270. Class AB bias circuit 221 is arranged to provide signals AB_Bias1 and AB_Bias2 from signals IS_outP and IS_outM to bias class AB output stage 251 for class AB operation, so that transistors P1 and N1 may conduct simultaneously for a portion of the cycle. Capacitor C1 is arranged to block any DC bias across the speaker and to prevent constant current through the speaker for zero input signal.

Figure 3:
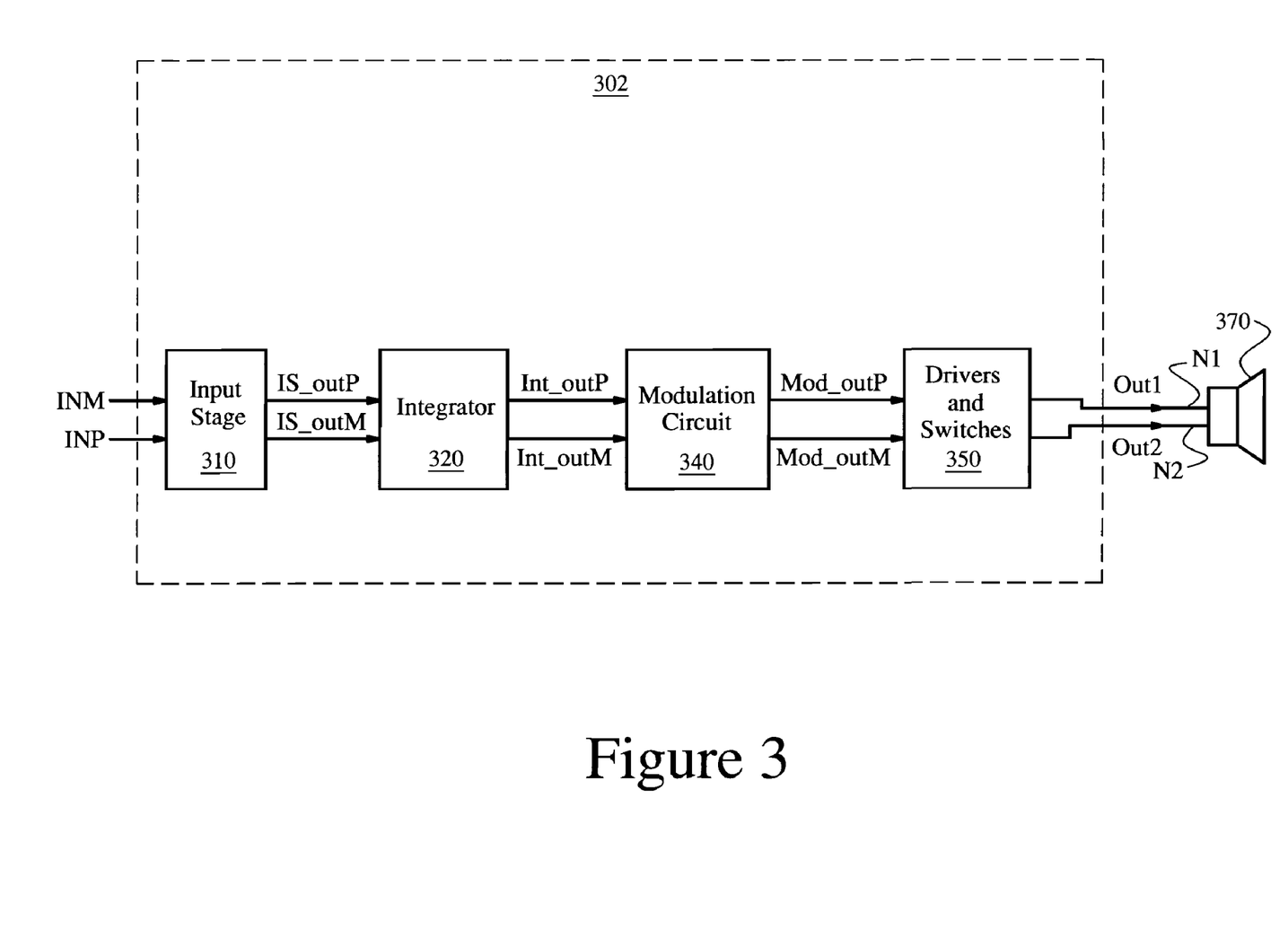
FIG. 3 shows a block diagram of an embodiment of a speaker and a class D amplifier that includes the input stage of FIG. 1.

FIG. 3 shows a block diagram of an embodiment of class D amplifier 302 and speaker 370. Class D amplifier 302 is operable to receive differential input signal IN, (where differential input signal IN includes signals INP and INM), and to provide class D differential output signal OUT (which includes signals OUT1 and OUT2) for driving speaker 370. Class D amplifier 302 may include input stage 310, integrator 320, modulation circuit 340, and driver and switches 350. Input stage 310 is an embodiment of input stage 110 of FIG. 1. Further, various embodiments may include more or less components that illustrated in FIG. 1. For example, integrator 320 is an optional component that need not be included in class D amplifier 302. Also, although a fully differential embodiment is shown in FIG. 3, in other embodiments, some of the components and signals are single-ended rather than differential. Additionally, although not shown in FIG. 3, class D amplifier 302 may further include passive or active feedback.

Input stage 310 may be operable to buffer differential input signal IN, to provide input stage output signal IS_OUT (which includes signals IS_outP and IS_outM). In some embodiments, input stage 310 also provides differential gain.

Integrator 320 may be arranged to integrate signal IS_out to provide integrator output signal Int_out (where signal Int_out is a differential signal that includes signals Int_outP and Int_outM).

Figure 5:
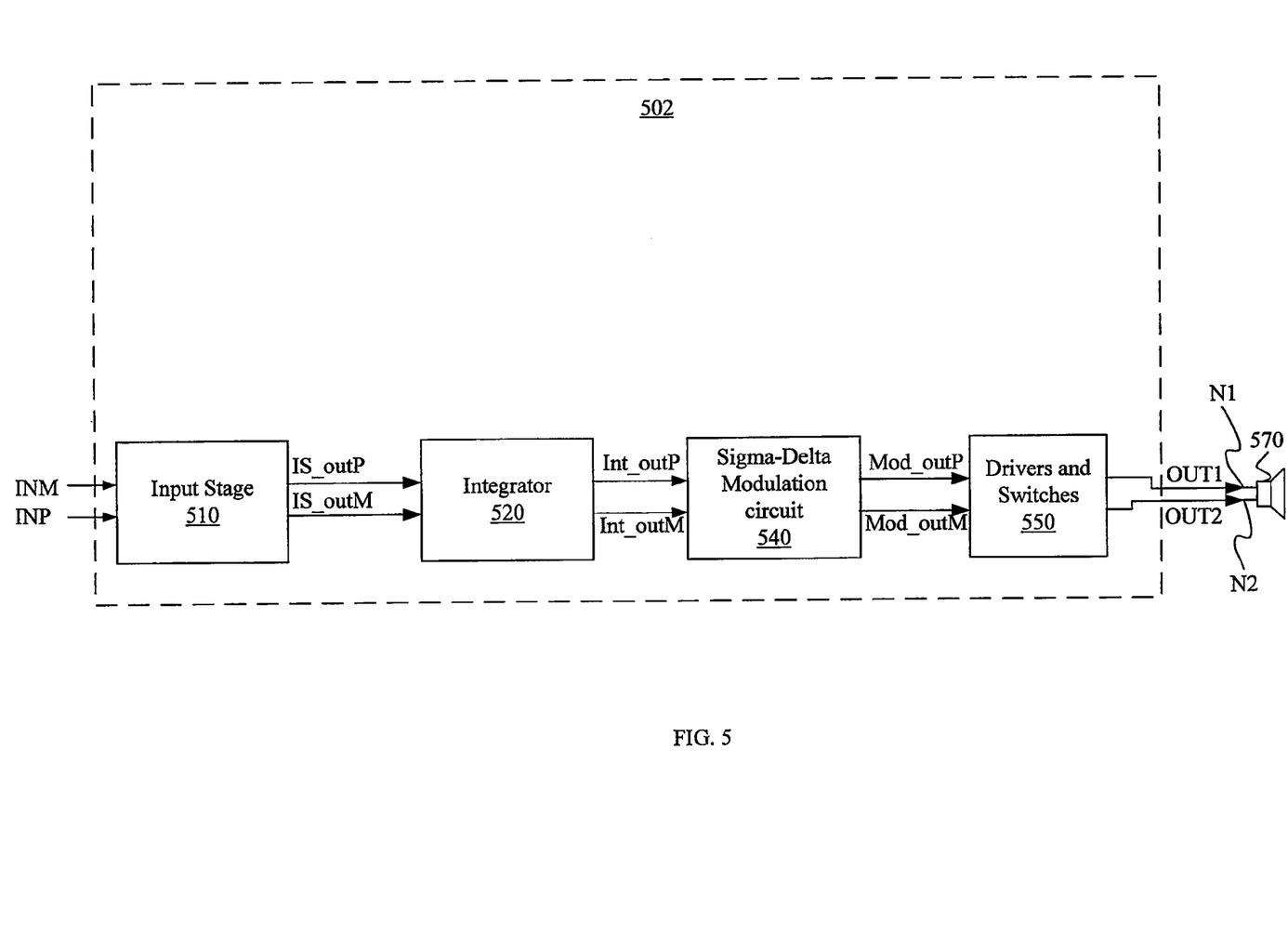
FIG. 5 shows a block diagram of an embodiment of the speaker and class D amplifier of FIG. 3 in which the modulation circuit is a sigma-delta modulation circuit.
Figure 6:
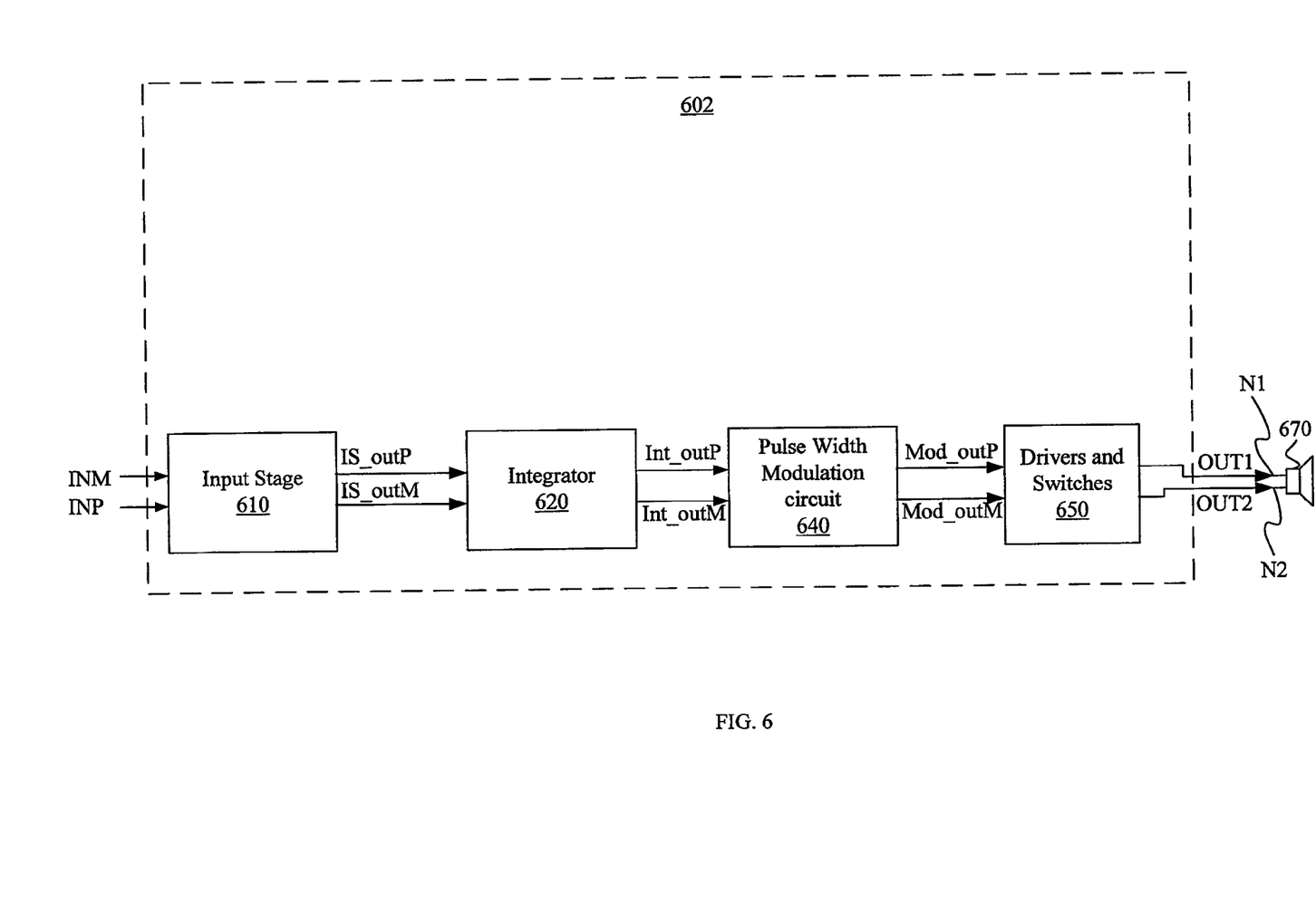
FIG. 6 shows a block diagram of an embodiment of the speaker and class D amplifier of FIG. 3 in which the modulation circuit is a pulse width modulation circuit.

Also, modulation circuit 340 is arranged to provide modulation output signal Mod_out from signal Int_out, where signal Mod_out is a differential signal that includes signals Mod_outP and Mod_outM. In one embodiment, modulation circuit 340 is a pulse width modulation circuit (as shown in FIG. 6 in one embodiment) that performs pulse width modulation on signal Int_out to provide signal Mod_out. In other embodiments, modulation circuit 340 may be a pulse frequency modulation circuit, a sigma-delta modulation circuit (as shown in FIG. 5 in one embodiment), or the like.

Drivers and switches 350 form a class D amplifier output stage that provides class D amplifier output signal OUT based on modulation output signal Mod_out. Signal OUT includes signals OUT1 and OUT2, which are provided at class D amplifier output nodes N1 and N2, respectively.

In one embodiment, differential signal IN is a differential audio input signal. In another embodiment, two or more differential audio signals are summed at the input of circuit 302 to provide signal IN. In another embodiment, signal INP is a single-ended audio signal, and INM is connected to ground or to a reference voltage. In another embodiment, two or more single-ended signals are summed to provide signal INP, and INM is connected to ground or to a reference voltage.

In one embodiment, all of the components illustrated in class D amplifier 302 are included in an integrated circuit. However, in other embodiments, some of the components shown in class D amplifier 302 are external to the integrated circuit. For example, in some embodiments, drivers and switches 350 are included in the integrated circuit. In other embodiments, drivers and switches 350 are external components.

Figure 4:
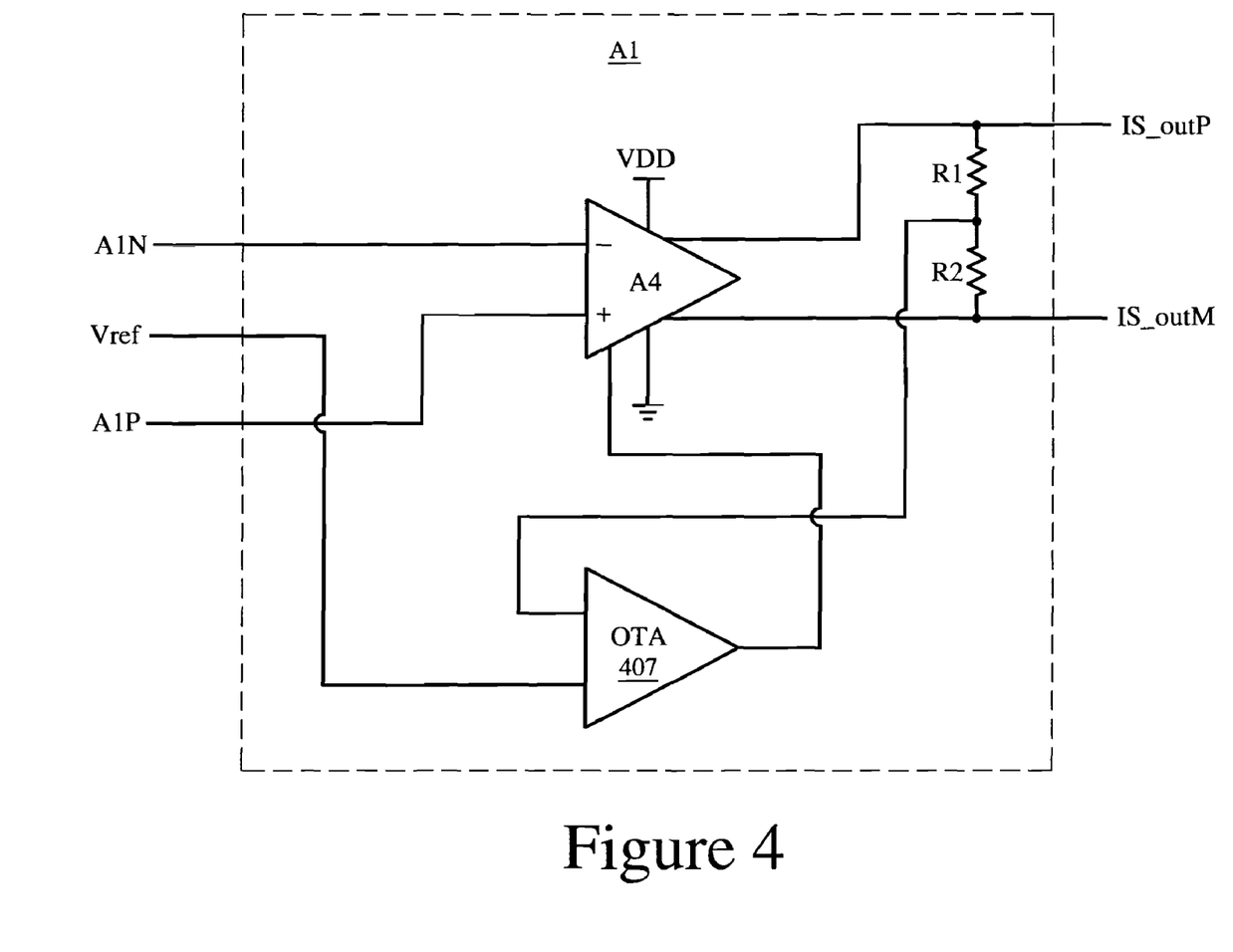
FIG. 4 illustrates an embodiment of fully differential op amp of FIG. 1, arranged in accordance with aspects of the present invention.

FIG. 4 illustrates an embodiment of fully differential op amp A1 of FIG. 1. Fully differential op amp A1 includes differential op amp A4, operational transconductance amplifier (OTA) 407, resistor R1, and resistor R2. Resistors R1 and R2 have substantially the same resistance. The output of OTA 407 is coupled to the gate of a current mirror within differential op amp A4.

FIG. 5 shows a block diagram of an embodiment of class D amplifier 502 and speaker 570, which are embodiments of class D amplifier 302 and speaker 370 of FIG. 3. In class D amplifier 502, the modulation circuit 540 is a sigma-delta modulation circuit.

FIG. 6 shows a block diagram of an embodiment of class D amplifier 602 and speaker 670, which are embodiments of class D amplifier 302 and speaker 370 of FIG. 3. In class D amplifier 602, the modulation circuit 640 is a sigma-delta modulation circuit.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for a high power supply rejection ratio, comprising:
   an input stage for an audio power amplifier, including:
      a supply-independent reference voltage generation circuit having at least an output, wherein the supply-independent reference voltage generation circuit is arranged to provide a reference voltage having a value that is independent of a value of a supply voltage; and
      a fully differential amplifier for processing audio signals having at least a first input, a second input, a common mode voltage input, a first output, and a second output, wherein the common mode voltage input is coupled to the output of the supply-independent reference voltage generation circuit.

2. The circuit of claim 1,
   wherein the supply-independent reference voltage is arranged to provide a supply-independent reference voltage at the output of the supply-independent reference voltage circuit; and
   wherein the fully differential amplifier is arranged to receive a differential input voltage across the first and second input of the differential amplifier, to receive the supply-independent reference voltage at the common mode input of the fully differential amplifier, and to provide a fully differential amplifier output voltage across the first and second output of the fully differential amplifier, such that the fully differential amplifier output voltage is based, in part, on the differential input voltage, and such that the common mode voltage of the fully differential amplifier output voltage is substantially equal to the supply-independent reference voltage.

3. The circuit of claim 1, wherein the supply-independent reference voltage generation circuit is arranged to provide a supply-independent reference voltage at the output of the supply-independent reference voltage generation circuit, the supply-independent reference voltage generation circuit includes a bandgap reference that is arranged to provide a bandgap voltage, and wherein the supply-independent reference voltage generation is based, at least in part, on the bandgap voltage.

4. The circuit of claim 1, further comprising:
a class AB bias circuit including a first input that is coupled to the first output of the fully differential amplifier, a second input that is coupled to the second output of the fully differential amplifier, a first output, and a second output.

5. The circuit of claim 4, further comprising:
a class AB output stage that is coupled to the first and second outputs of the class AB bias circuit, wherein the class AB output stage includes a first transistor and a second transistor.

6. The circuit of claim 1, further comprising:
a modulation circuit that is coupled to the first and second outputs of the fully differential amplifier.

7. The circuit of claim 6, wherein the modulation circuit is a sigma-delta modulation circuit.

8. The circuit of claim 6, wherein the modulation circuit is a pulse width modulation circuit.

9. The circuit of claim 1, further comprising:
an integrator having at least a first input, a second input, a first output, and a second output, wherein the first input of the integrator is coupled to the first output of the fully differential amplifier, and wherein the second input of the integrator is coupled to the second output of the fully differential amplifier; and
a modulation circuit having a first input and a second input, wherein the first input of the pulse modulation circuit is coupled to the first output of the integrator, and wherein the second input of the pulse modulation circuit is coupled to the second output of the integrator.

10. The circuit of claim 9, further comprising:
a plurality of driver circuits that are coupled to the modulation circuit;
a plurality of switches that are coupled to the plurality of driver circuits, and further coupled to first and second class D amplifier output nodes, wherein the modulation circuit is a pulse width modulation circuit.

11. A circuit for a high power supply rejection ratio, comprising:
an audio power amplifier, including:
a supply-independent reference voltage generation circuit having at least an output, wherein the supply-independent reference voltage generation circuit is arranged to provide a reference voltage having a value that is independent of a value of a supply voltage;
a fully differential amplifier for processing audio signals having at least a first input, a second input, a common mode voltage input, a first output, and a second output, wherein the common mode voltage input is coupled to the output of the supply-independent reference voltage generation circuit; and
an output stage.

12. A circuit for a high power supply rejection ratio, comprising:
an audio power amplifier, including:
a supply-independent reference voltage generation circuit having at least an output, wherein the supply-independent reference voltage generation circuit is arranged to provide a reference voltage having a value that is independent of a value of a supply voltage;
a fully differential amplifier for processing audio signals having at least a first input, a second input, a common mode voltage input, a first output, and a second output, wherein the common mode voltage input is coupled to the output of the supply-independent reference voltage generation circuit; and
an output stage, wherein the audio power amplifier is a class AB amplifier or a class D amplifier.

13. The circuit of claim 11, wherein the audio power amplifier is a class AB amplifier, and the output stage is a class AB output stage.

14. The circuit of claim 13,
wherein the audio power amplifier further includes:
a class AB bias circuit having a differential input that is coupled to the first and second outputs of the fully differential amplifier, and first and second outputs that are coupled to the class AB output stage.

15. The circuit of claim 11, wherein the audio power amplifier is a class D amplifier, and the output stage is a class D output stage.

16. The circuit of claim 15, further comprising:
an integrator that is coupled to the fully differential amplifier;
a modulation circuit that is coupled to the integrator and the class D output stage.

17. A method for a high power supply rejection ratio, comprising:
providing audio power amplification based, in part, on a first differential voltage, to provide a power amplification output signal, wherein providing the audio power amplification includes:
receiving a supply-independent reference voltage, wherein a value of the supply-independent reference voltage is independent of a value of a supply voltage;
receiving a first differential voltage;
providing a second differential voltage such that the second differential voltage is substantially proportional to the first differential voltage, and such that a common mode of the second differential voltage is substantially equal to the supply-independent reference voltage; and
providing the audio power amplification output signal based, in part, on the second differential voltage.

18. The method of claim 17, further comprising:
providing the supply-independent reference voltage, including:
providing a bandgap voltage; and
providing the supply-independent reference voltage based, at least in part, on the bandgap voltage.

19. The method of claim 17, wherein
providing the audio power amplifier output signal includes:
providing a first class AB bias signal and a second class AB bias signal to a class AB output stage, such that the first and second class AB bias signal are based, in part, on the second differential voltage.

20. The method of claim 17, wherein
providing the audio power amplifier output signal includes:

integrating the second differential signal to provide an integration output signal;
modulating the integration output signal to provide a modulation output signal; and
providing the modulation output signal to a class D output stage.

* * * * *